United States Patent [19]
Andow et al.

[11] 4,073,009
[45] Feb. 7, 1978

[54] APPARATUS FOR CALCULATING AMPLITUDE VALUES OF SINUSOIDAL WAVES

[75] Inventors: Fumio Andow, Hachioji; Tetsuo Matsushima, Fuchu; Minoru Iwasaki, Kokubunji, all of Japan

[73] Assignees: Tokyo Shibaura Denki Kabushiki Kaisha; Tokyo Denryoku Kabushiki Kaisha, both of Japan

[21] Appl. No.: 717,939

[22] Filed: Aug. 26, 1976

[30] Foreign Application Priority Data

Aug. 29, 1975 Japan .................. 50-104056

[51] Int. Cl.² .................. G06F 15/20; G01R 19/04
[52] U.S. Cl. .................. 364/602; 307/352; 307/354; 324/103 R; 328/135; 328/151; 364/483

[58] Field of Search .............. 235/150.5, 150.53, 197, 235/193, 151.31; 340/347 AD, 248 R, 248 A, 248 BC, 253 A, 310 A; 328/14, 135, 146, 151; 307/235 A, 235 B, 235 C, 235 E, 24, 31, 33, 52, 59, 125, 126, 130, 131; 324/140 R, 141, 142, 103 R, 77 A

[56] References Cited

U.S. PATENT DOCUMENTS

| | | | |
|---|---|---|---|
| 3,524,075 | 8/1070 | Matthews et al. | 328/146 X |
| 3,569,785 | 3/1971 | Durbeck et al. | 235/151.31 X |
| 3,599,103 | 8/1971 | Nussbaumer et al. | 328/135 |
| 3,758,763 | 9/1973 | Nohara et al. | 324/103 R X |
| 3,848,586 | 11/1974 | Suzuki et al. | 328/151 X |

*Primary Examiner*—Joseph F. Ruggiero
*Attorney, Agent, or Firm*—Stevens, Davis, Miller & Mosher

[57] ABSTRACT

The apparatus comprises a sampling hold circuit for sampling the amplitude of a sinusoidal wave at a predetermined frequency, a data sample extracting circuit for extracting two data samples at two points immediately before and after the peak value of the sinusoidal wave, and an operation circuit responsive to the absolute values of the two data samples for calculating the amplitude value of the sinusoidal wave.

14 Claims, 14 Drawing Figures

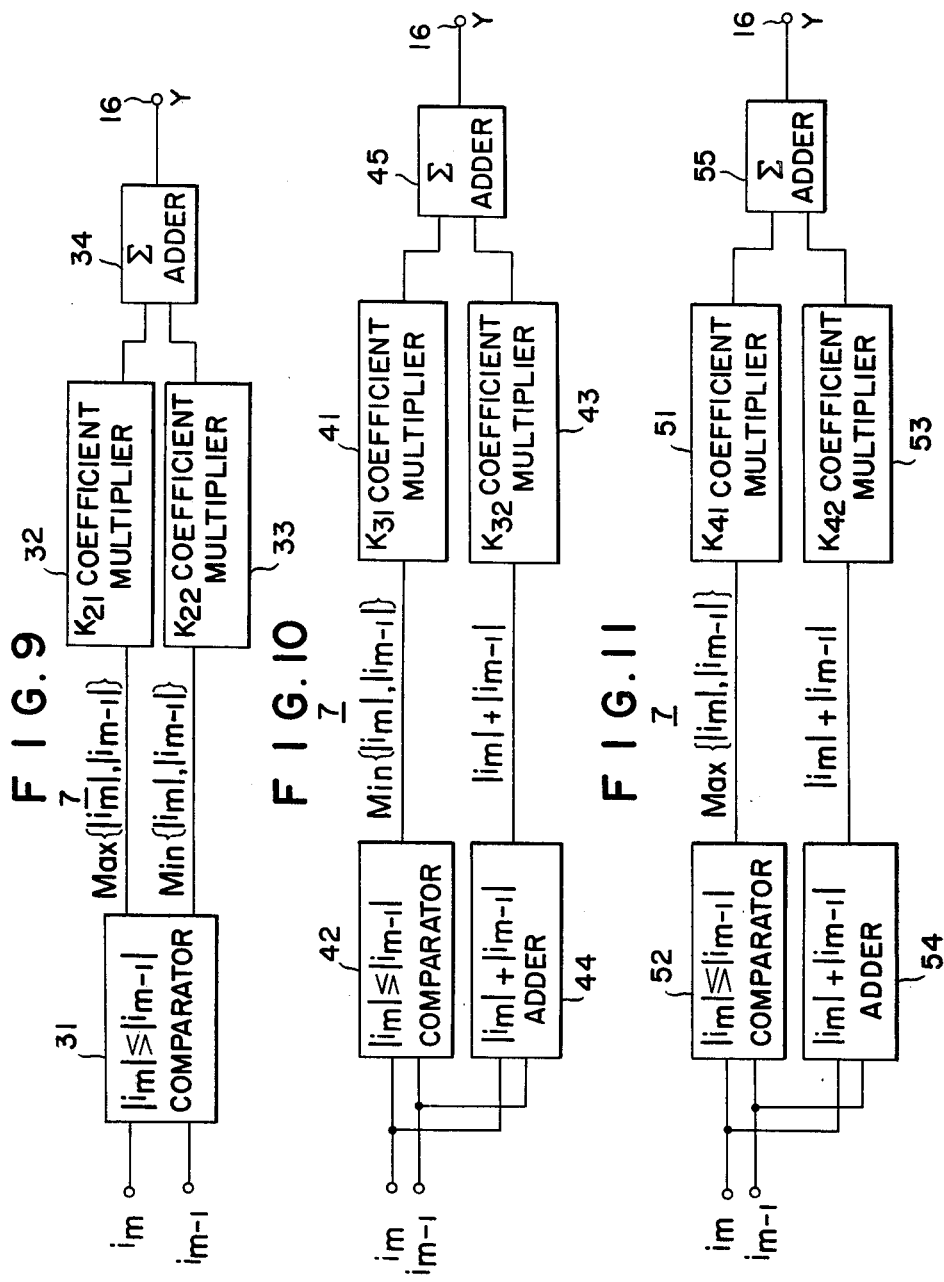

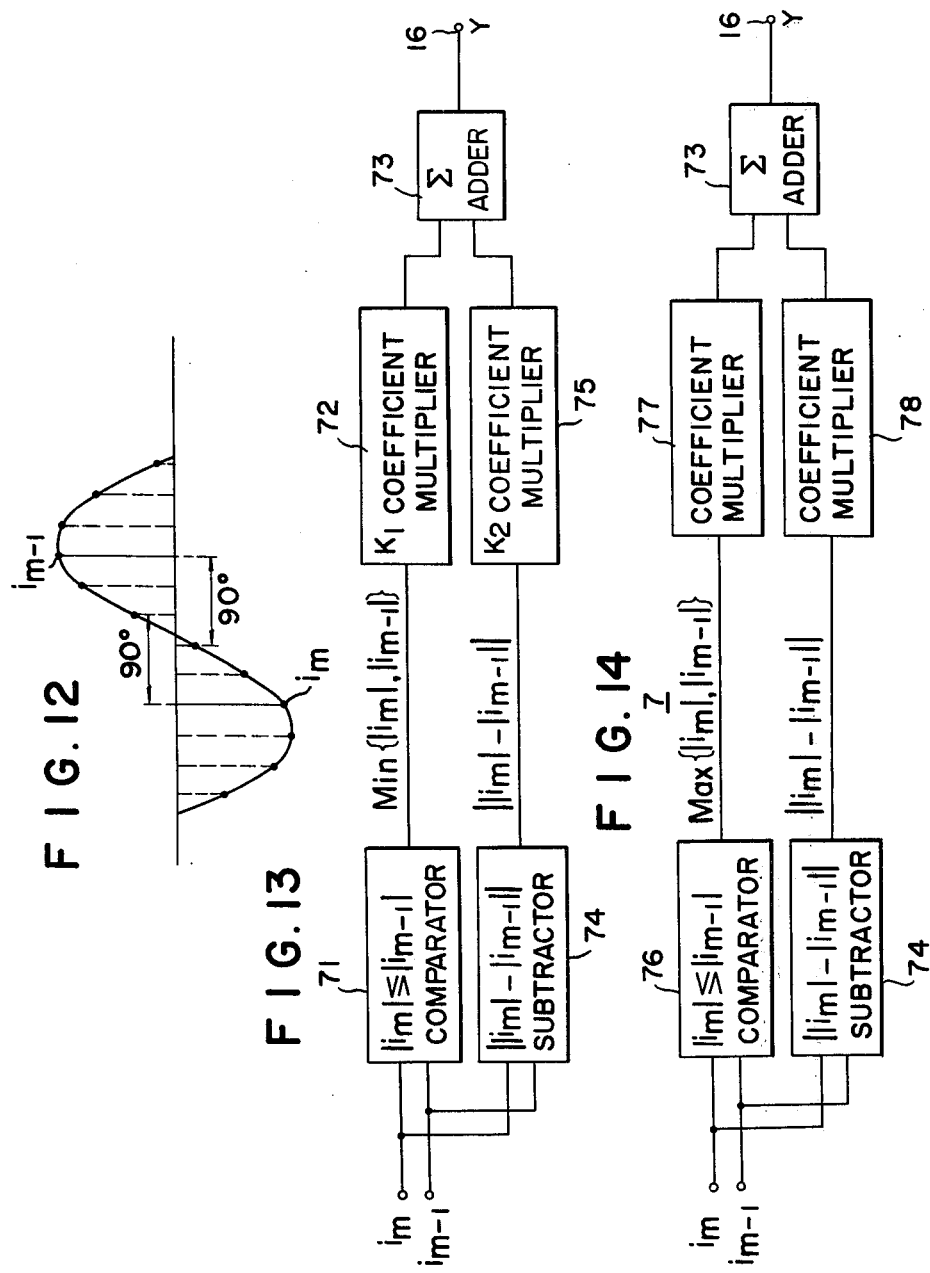

APPARATUS FOR CALCULATING AMPLITUDE VALUES OF SINUSOIDAL WAVES

BACKGROUND OF THE INVENTION

This invention relates to apparatus for calculating the amplitude value of a sinusoidal wave by sampling at a predetermined interval a sinusoidal voltage or current and then calculating the amplitude value of the voltage or current from a digital signal corresponding to the sampled value.

The calculating apparatus of this type are used for the remote control of the switches, measurement instruments, machines and apparatus of an electric power system. The digital signal corresponding to the sampled value is encoded and then transmitted to apparatus for calculating the amplitude value installed in a receiving station.

The following three methods of calculation have been used in the calculating apparatus.

The first method is an addition method wherein the absolute values of a plurality of data samples sampled in one half cycle of a sinusoidal voltage or current (hereinafter called an input alternating current) are added together and the result of addition is multiplied with a predetermined constant thereby determining the amplitude value of the input alternating current as shown in FIG. 1.

In FIG. 1 when an input alternating current having a frequency of 50 Hz is sampled at a sampling frequency of 600 Hz, the sampling period is 30° so that the amplitude value can be determined by the following equation $$I = \frac{1}{3.798} \sum_{k=m-5}^{m} |i_k| \tag{1}$$

where $m$ represents a time series, and $i_k$ an instantaneous value expressed by the following equation (2).

$$i = I \sin \omega t. \tag{2}$$

Taking $m - 5$ as the reference for the sampling points and assuming that the phase of the input alternating current is $\omega t$, then the righthand side of equation (1) will be expressed as follows.

$$\text{Righthand side} = \frac{1}{3.798} \{|\sin \omega t| + |\sin (\omega t + \frac{1}{6} \pi)| \tag{3}$$
$$+ |\sin (\omega t + \frac{2}{6} \pi)| + |\sin (\omega t + \frac{3}{6} \pi)|$$
$$+ |\sin (\omega t + \frac{4}{6} \pi)| + |\sin (\omega t + \frac{5}{6} \pi)|$$

In equation (3) the range of $\omega t$ is limited by an equation $$0 \leq \omega t \leq \frac{\pi}{12} \tag{4}$$

so the righthand side of equation (3) will become as follows by taking into consideration the periodicity of the input alternating current.

$$\frac{2I}{3.798} \cdot (\cos \frac{5}{12} \pi + \cos \frac{3}{12} \pi + \cos \frac{1}{12} \pi) \cdot \sin (\omega t + \frac{5}{12} \pi)$$
$$= \cdot I \cdot \sin (\omega t + \frac{5}{12} \pi) \tag{5}$$

This equation shows that the error of the addition method caused by the variation in the sampling phase is less than ±1.7%.

The second method is a peak value detection method wherein data having the largest absolute value is selected among sampled data obtained in one half cycle or more and the selected data is used as the amplitude value. The selected maximum data shows the amplitude value of the input alternating current with an error in a definite range. Thus, for example, in the same manner as the addition method described above, when an input alternating current having a frequency of 50 Hz is sampled at a sampling frequency of 600 Hz the phase of the data having a maximum absolute value ranges from sin $5/12 \pi$ to sin $\frac{1}{2} \pi$ so that the error caused by the variation of the sampling phase is less than ± 1.7% in the same manner as above described.

The third method is the square method. There is a formula regarding trigonometrical functions $$\sin^2 \theta + \cos^2 \theta = \sin^2 \theta + \sin^2(\theta + \frac{\pi}{2}) = 1 \tag{6}$$

Thus, by availing the fact that the sum of squares of two sampling data dephased 90 electrical degrees is equal to the square of the amplitude value of the input alternating current, the amplitude value can be determined from the square root of said sum.

For example, similar to FIG. 1, when the input alternating current of 50 Hz is sampled at a sampling frequency of 600 Hz the square of the amplitude value can be determined by the following equation $$I^2 = i_m^2 + i_{m-3}^2 \tag{7}$$

In principle, this square method is free from any error due to the variation in the sampling phase.

Thus, of these three methods the square method is most advantageous in that it does not accompany the error caused by the variation in the sampling phase, but this method is inconvenient since it is necessary to calculate a square root by using equation (7). When calculating a square root with an electronic computer it takes much longer time than an addition operation.

Although the addition method or the peak value detection method does not require such mathematical operation, it accompanies the error caused by the variation in the sampling phase.

SUMMARY OF THE INVENTION

Accordingly, it is an object of this invention to provide novel apparatus for calculating the amplitude value of a sinusoidal current or voltage in which it is not necessary to calculate a square root and which can greatly reduce the error caused by the variation in the sampling phase over the prior art addition method or peak value detection method.

According to this invention there is provided apparatus for calculating an amplitude value of a sinusoidal wave comprising means for sampling the amplitude of the sinusoidal wave at a predetermined interval, a sampled data extracting circuit for extracting two sampled data samples at two points spaced from the peak value of the sinusoidal wave, and an operation circuit responsive to the absolute values of said two data samples for calculating the amplitude value of the sinusoidal wave.

BRIEF DESCRIPTION OF THE DRAWINGS

In the accompanying drawings:

FIGS. 9, 10 and 11 show modified operation circuits;

FIG. 12 is a graph showing a modified method of deriving two data samples; and

FIGS. 13 and 14 show further modifications of the operation circuits.

DESCRIPTION OF THE PREFERRED EMBODIMENTS

Figure 1:
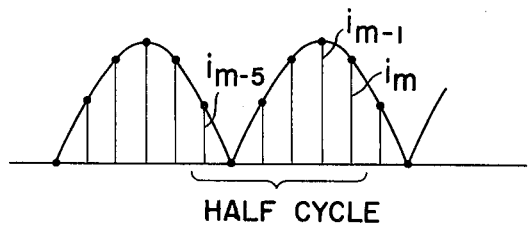
FIG. 1 is a diagram showing a manner of sampling an input alternating current by a sampling frequency of 600 Hz.

A preferred embodiment wherein an input alternating current having a frequency of 50 Hz is sampled at a sampling frequency of 600 Hz similar to FIG. 1 will now be described in detail.

Figure 2:
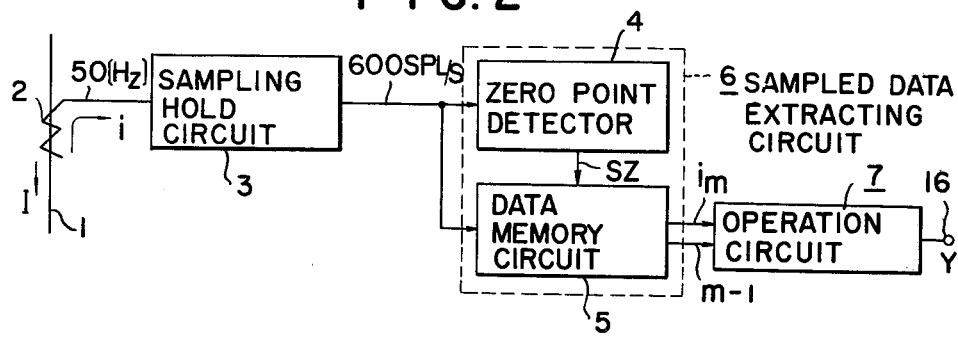
FIG. 2 is a block diagram showing one embodiment of the apparatus for calculating the amplitude value of a sinusoidal wave embodying the invention.

In FIG. 2 the current I flowing through a power system 1 is derived out through a current transformer 2. The output current $i$ of the current transformer is sampled at any sampling frequency by a sampling hold circuit 3. Assuming that the frequency of the power system 1 is 50 Hz and that the sampling frequency is 600 Hz, then the sampling period is 30°. The data samples are applied to a zero point detector 4. In response to successively sampled data, the zero point detector 4 compares the sign of a present data sample with that of a data sampled immediately preceding the present data. When the signs of both data are not equal, the zero point detector 4 produces a zero point detection signal SZ which means that the waveform of the input alternating current has passed through a zero point.

Figure 3:
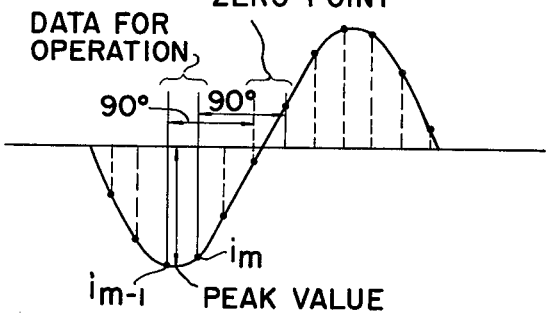
FIG. 3 is a graph utilized to explain the operation of the apparatus shown in FIG. 2.

There is provided a data memory circuit 5 which stores the present data samples together with a predetermined number of data in more than one half cycle preceding the present data which are sent from the sampling hold circuit 3. When a zero point detection signal SZ is applied, the data memory circuit 5 produces two sampled data $i_m$ and $i_{m-1}$ which are sampled at phase positions 90° preceding two data samples respectively sampled before and after a zero point, that is the present data and an immediately preceding data, as shown in FIG. 3. For this reason, two data $i_m$ and $i_{m-1}$ produced by the memory circuit 5 represent the data samples before and after the peak value of the input alternating current. Thus, the zero point detector 4 and the data memory circuit 5 constitute a sampled data extracting circuit 6.

As the data memory circuit 5 may be used a shift register in which case the sampling period is set to an integer fraction of 90° of the frequency of the input alternating current. An operation circuit 7 is provided to calculate the amplitude value from the two outputs $i_m$ and $i_{m-1}$ from the data memory circuit 5.

Figure 4:
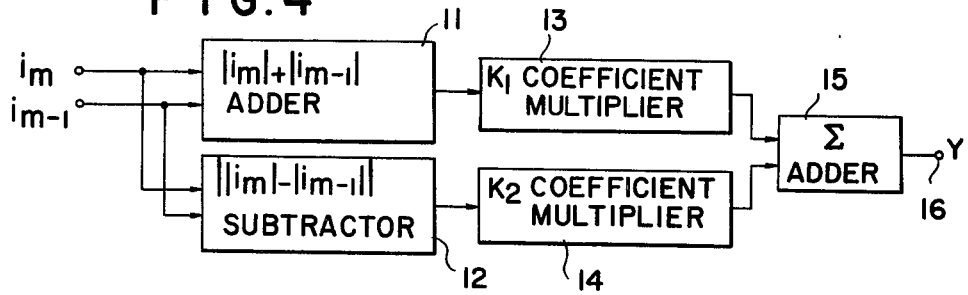
FIG. 4 is a block diagram showing one example of the operation circuit shown in FIG. 2.

FIG. 4 shows one example of the operation circuit 7 comprising an adder 11 which adds together the absolute values $|i_m|$ and $|i_{m-1}|$ of two inputs $i_m$ and $i_{m-1}$ for producing a sum $|i_m| + |i_{m-1}|$. The output from the adder 11 is multiplied by a coefficient $K_1$ by a first coefficient multiplier 13 to produce an output $K_1\{|i_m| + |i_{m-1}|\}$ which is applied to an adder 15. The inputs $i_m$ and $i_{m-1}$ are also applied to a subtractor 12 which calculates the absolute value of the difference of $|i_m|$ and $|i_{m-1}|$ for the purpose of always producing a positive output. The output $||i_m| - |i_{m-1}||$ from the subtractor 12 is multiplied by a coefficient $K_2$ by a second coefficient multiplier 14 and the output $K_2||i_m| - |i_{m-1}||$ from the second coefficient multiplier 14 is applied to the second input of adder 15.

Thus, the output Y produced on output terminal 16 is the amplitude value to be determined.

$$Y = K_1\{|i_m| + |i_{m-1}|\} + K_2||i_m| - |i_{m-1}|| \qquad (8)$$

where $m$ represents a time series, and $K_1$ and $K_2$ are constants including 1.

Examining the range of variation of the amplitude value Y thus obtained, let us put $$i_{m-1} = I \sin \omega t \text{ and } i_m = I \sin (\omega t + \frac{\pi}{6}) \qquad (9)$$

Since $i_m$ and $i_{m-1}$ are data samples before and after the peak of the input alternating current, the phase $\omega t$ varies in a range $$\frac{5}{12}\pi \leq \omega t \leq \frac{1}{2}\pi \qquad (10)$$

Equation (8) can be modified as follows.

$$Y = (K_1 + K_2) I \sin \omega t + (K_1 - K_2) I \sin (\omega t + \frac{\pi}{6})$$

$$= (K_1 + K_2) I \sin \omega t$$

$$+ (K_1 - K_2) I (\cos \frac{\pi}{6} \sin \omega t + \sin \frac{\pi}{6} \cos \omega t)$$

$$= (\frac{2 + \sqrt{3}}{2} K_1 + \frac{2 - \sqrt{3}}{2} K_2) I \sin \omega t$$

$$+ \frac{1}{2}(K_1 - K_2) I \cos \omega t \qquad (11)$$

By putting the following $k_1$ and $k_2$ in equation (11)

$$\left. \begin{array}{l} k_1 = \frac{2 + \sqrt{3}}{2} K_1 + \frac{2 - \sqrt{3}}{2} K_2 \\ k_2 = \frac{1}{2}(K_1 - K_2) \end{array} \right\} \qquad (12)$$

equation (11) can be rewritten as follows $$Y = k_1 I \sin \omega t + k_2 I \cos \omega t = \sqrt{k_1^2 + k_2^2} I \sin (\omega t + \alpha) \qquad (13)$$

$$\text{where } \alpha = \sin^{-1} \frac{k_2}{\sqrt{k_1^2 + k_2^2}}; \qquad (14)$$

-continued $$\text{and } \alpha = \cos^{-1} \frac{k_1}{\sqrt{k_1^2 + k_2^2}};$$

Figure 5:
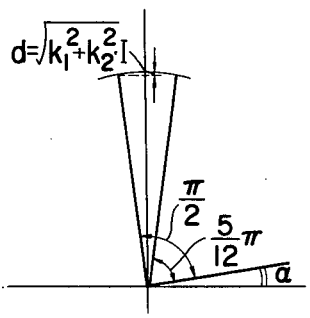
FIG. 5 is a vector diagram showing the variation in the amplitude value.

However, the variation in the amplitude value Y expressed by equation (13) caused by the variation in the sampling phase expressed by equation (10) is represented by a component of variation $d = \sqrt{k_1^2 + k_2^2} \cdot I$ along the ordinate as shown by a vector diagram shown in FIG. 5.

When $K_1$ and $K_2$ are selected to satisfy a relation $K_1/K_2 = 2.03$, for example $$d = \sqrt{k_1^2 + k_2^2} \cdot I \cdot \sin(90° - 7.5°) \quad (16)$$

and the minimum value of variation d can be expressed by $$d = (0.991 - 1.0) \times \sqrt{k_1^2 + k_2^2} \cdot I$$

The error at this time is ± 0.43 %.

This result was obtained by selecting the ratio $K_1/K_2 = 2.03$ so as to minimize the error but for a practical purpose, an approximate solution can be obtained by selecting the ratio $K_1/K_2 = 2$.

Although in the embodiment shown in FIG. 2 the data sample applied to the operation circuit 7 was a data sampled at a phase position 90° before the point at which the zero point detection signal SZ was operated, it is also possible to use a data sampled at a phase position 90° after the point of detecting the zero point detection signal SZ.

Figure 6:
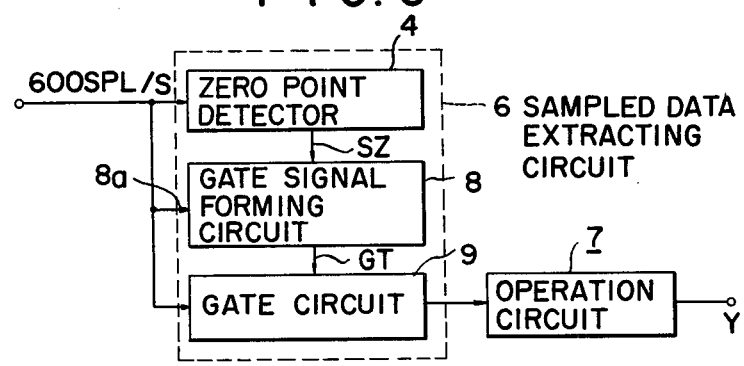
FIG. 6 is a block diagram showing a modification of the data sample extracting circuit.
Figure 7:
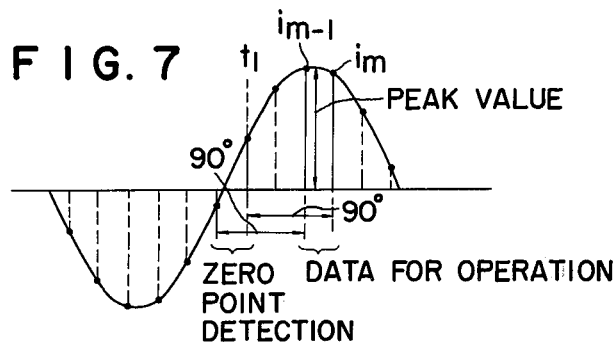
FIG. 7 is a graph utilized to explain the operation of the modified data sample extracting circuit shown in FIG. 6.

To this end a modified data sample extracting circuit as shown in FIG. 6 can be used, wherein a gate signal forming circuit 8 is triggered by the zero point detection signal SZ from the zero point detector 4. The gate signal forming circuit 8 comprises a counter which counts the number of the data samples applied to its input 8a. Thus, the gate signal forming circuit 8 produces a gate signal GT when it receives the second and third data after receiving a zero point detection signal SZ which is generated at an instant $t_1$ when a sampled data arrives at the zero point detector 4 succeeding to the zero point detection interval as shown in FIG. 7. The gate signal GT is applied to a gate circuit 9 so as to cause it to supply to the operation circuit 7 only two data samples $i_m$ and $i_{m-1}$ before and after a phase position 90° delayed from a point at which the input alternating current has passed through a zero point, as shown in FIG. 7.

With the modification shown in FIG. 6 it is possible to calculate the amplitude value with a maximum error of ± 0.43 % in the same manner as the embodiment shown in FIG. 2.

The gate signal forming circuit 8 shown in FIG. 6 may be constructed such that after receiving a zero point detection signal SZ, it counts the number of pulses generated by a clock pulse generator, not shown, contained in the gate signal forming circuit thus forming a gate signal for the two sampled data before and after the peak value.

A memory circuit similar to the data memory circuit 5 shown in FIG. 2 may be substituted for the gate pulse forming circuit 8 and the gate circuit 9 shown in FIG. 6.

Figure 8:
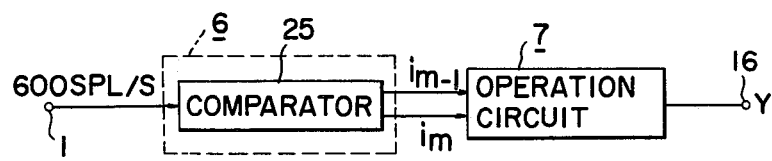
FIG. 8 is a block diagram showing another embodiment of this invention.

Another embodiment of this invention is shown in FIG. 8 wherein the data samples extracting circuit 6 comprises a comparator 25 which stores the data regarding the preceding half cycle out of a plurality of sampled data arriving at the input terminal of the comparator 25 and produces as its output a data having a maximum absolute value and a data having an absolute value next to said maximum absolute value. The two output $i_{m-1}$ and $i_m$ from comparator 25 are applied to the operation circuit 7.

The two data $i_{m-1}$ and $i_m$ provided by the comparator are equal to the data which are sampled before and after the peak value in the preceding half cycle of the input alternating current. For this reason, with the amplitude value calculating apparatus shown in FIG. 8 it is also possible to obtain the result with an error of ±0.43 % as has been discussed with reference to FIG. 2.

The operation circuit utilized in the foregoing embodiments is not limited to that shown in FIG. 4, and modified operation circuits shown in FIGs. 9 to 11 can also be used.

The operation circuit 7 shown in FIG. 9 comprises a comparator 31 which compares the absolute values of two sampled data $|i_m|$ and $|i_{m-1}|$ for applying larger data Max $\{|i_m|, |i_{m-1}|\}$ to a coefficient multiplier 32 for multiplying it with a coefficient $K_{21}$. The comparator 31 also supplies smaller data Min $\{|i_m|, |i_{m-1}|\}$ to the other coefficient multiplier 33 for multiplying it with a coefficient $K_{22}$. The outputs of both coefficient multipliers are added each other by an adder 34 to provide an output.

$$Y = K_{21} \text{Max}\{|i_m|, |i_{m-1}|\} + K_{22} \text{Min}\{|i_m|, |i_{m-1}|\} \quad (17)$$

The variation in the sampling phase in this case can be determined in the same manner as has been discussed with reference to equation (10). Thus, equation (17) can be modified as follows $$Y = K_{21} \sin \omega t + K_{22} \sin(\omega t + \frac{\pi}{6}) \quad (18)$$

$$= (K_{21} + \frac{\sqrt{3}}{2} K_{22}) \sin \omega t + \frac{1}{2} K_{22} \cos \omega t$$

By putting $$k_1 = K_{21} + \frac{\sqrt{3}}{2} K_{22} \text{ and } k_2 = \frac{1}{2} K_{22} \quad (19)$$

equation (18) can be modified to have the same form as equation (13).

Accordingly, by selecting the values of coefficients $K_{21}$ and $K_{22}$ to satisfy a relation $k_1/k_2 = 7.60$ that is $K_{21}/K_{22} = 2.93$, it is possible to calculate the amplitude value with an error of ±0.43%.

The modified operation circuit shown in FIG. 10 comprises a comparator 42 which supplies smaller data Min $\{|i_m|, |i_{m-1}|\}$ of the absolute values $|i_m|, |i_{m-1}|$ of two data samples to a coefficient multiplier 41 and an adder 44 for applying the sum of the absolute values of two data samples $|i_m| + |i_{m-1}|$ to a coefficient multiplier 43. The outputs of two coefficients multipliers are added with each other by an adder 45 to produce an output $$Y = K_{31} \cdot \text{Min}\{|i_m|, |i_{m-1}|\} + K_{32} \cdot \{|i_m| + |i_{m-1}|\} = K_{32} \cdot \text{Max}\{|i_m|, |i_{m-1}|\} + (K_{31} + K_{32}) \cdot \text{Min}\{|i_m|, |i_{m-1}|\} \quad (20)$$

By putting $$K_{32} = K_{21} \text{ and } K_{31} + K_{32} = K_{22} \quad (21)$$

equation (20) can be modified to have the same form as equation (17). Thus, with the circuit shown in FIG. 10 it is also possible to calculate the amplitude value with an error of ±0.43%. However, to obtain the result with this error it is necessary to select the ratio $K_{31}/K_{32} = -0.659$.

The operation circuit 7 shown in FIG. 11 comprises a comparator 52 for applying larger data $\text{Max}\{|i_m|, |i_{m-1}|\}$ of the absolute values of two input data samples $|i_m|$ and $|i_{m-1}|$ to a coefficient multiplier 51, and an adder 54 for calculating and applying the sum of the absolute values $|i_m| + |i_{m-1}|$ of the two data samples to a coefficient multiplier 53. The outputs of coefficient multipliers 51 and 52 are added together by an adder 55 to provide an output.

$$Y = K_{41} \cdot \text{Max}\{|i_m|, |i_{m-1}|\} + K_{42} \cdot \{|i_m| + |i_{m-1}|\}$$
$$= (K_{41} + K_{42}) \text{Max}\{|i_m|, |i_{m-1}|\} + K_{42} \text{Min}\{|i_m|, |i_{m-1}|\} \quad (21)$$

By putting
$$K_{41} + K_{42} = K_{21} \text{ and } K_{42} = K_{22} \quad (22)$$

equation (21) can be modified to a form similar to equation (17). Accordingly, with the modification shown in FIG. 11, it is also possible to calculate the amplitude value with an error of ±0.43. In order to obtain a result of calculation with this error it is necessary to select a ratio $K_{41}/K_{42} = 1.93$.

Although in the foregoing embodiments, two data samples immediately before and after the peak value of an input alternating current were used as the data samples, by using the periodicity of the input alternating current, a first data on one side of the peak value in one half cycle and a second data at a corresponding phase position in another half cycle spaced from the first data more than 90° can also be used. For example, as shown in FIG. 12, where the first data is expressed by $i_{m-1} = \sin \omega t$, a data $i_m = I \sin(\omega t + \omega/6 - \omega/2)$ can be used as the second data sample.

The sampling frequency may be any frequency, but especially when the sampling frequency is equal to four times of the frequency of the input alternating current, that is when sampling is made at a spacing of 90° for the waveform of the input alternating current, adjacent two samples data comprise two which are sampled data immediately before and after the peak value of the input sinusoidal waveform or two data samples having the same absolute values as said two data samples, so that the data samples can be readily extracted without using any special means.

FIG. 13 shows still another operation circuit 7 comprising a comparator 71 which compares the absolute values $|i_m|$ and $|i_{m-1}|$ of two input sampled data $i_m$ and $i_{m-1}$ for producing a smaller one $\text{Min}\{|i_m|, |i_{m-1}|\}$ as its output which is multiplied with a coefficient $K_1$ by a coefficient multiplier 72 to produce an output $K_1 \text{Min}\{|i_m|, |i_{m-1}|\}$, and a subtractor 74 which produces the absolute value of the difference of the two input sampled values $i_m$ and $i_{m-1}$. The output $||i_m| - |i_{m-1}||$ from subtractor 74 is multiplied with a coefficient $K_2$ by a second coefficient multiplier 75 to produce an output $K_2\{|i_m| - |i_{m-1}|\}$ which is applied to an adder 73 together with the output from the first coefficient multiplier 72 to produce an output $$Y_1 = K_1 \text{Min}\{|i_m|, |i_{m-1}|\} + K_2||i_m| - |i_{m-1}|| \quad (23)$$

This output can be modified as follows
$$Y = K_2 \cdot \text{Max}\{|i_m|, |i_{m-1}|\} + (K_1 - K_2) \cdot \text{Min}\{|i_m|, |i_{m-1}|\} \quad (24)$$

By putting $K_2 = K_{21}$ and $K_1 - K_2 = K_{22}$, equation 24 can be modified to have the same form as that of equation 17. Thus, with the circuit shown in FIG. 13 it is also possible to calculate the amplitude value with an error of ±0.43%.

FIG. 14 shows still another modification of the operation circuit 7 comprising a comparator 76 for producing larger one $\text{Max}\{|i_m|, |i_{m-1}|\}$ of the absolute values of two input sampled data $i_m$ and $i_{m-1}$. The output from the comparator is applied to a first coefficient multiplier 77 to produce an output $K_3 \text{Max}\{|i_m|, |i_{m-1}|\}$ which is applied to an adder 73. The operation circuit 7 further comprises a subtractor 74 which produces the absolute value of the difference of $|i_m| - |i_{m-1}|$ which is multiplied with a coefficient $K_4$ by a second coefficient multiplier 78 and then applied to adder 73.

Thus, the adder produces an output
$$Y = K_3 \text{Max}\{|i_m|, |i_{m-1}|\} + K_4||i_m| - |i_{m-1}|| \quad (30)$$

This equation can be modified as follows
$$Y = (K_3 + K_4) \cdot \text{Max}\{|i_m|, |i_{m-1}|\} - K_4 \cdot \text{Min}\{|i_m|, |i_{m-1}|\} \quad (31)$$

By putting $K_3 + K_4 = K_{21}$ and $-K_4 = K_{22}$ equation (31) can be modified to have the same form as that of equation (17). Thus, with the circuit shown in FIG. 15 it is also possible to calculate the amplitude value with an error of ±0.43%.

As above described this invention provides apparatus for calculating an amplitude value of a sinusoidal wave with an error much smaller than the prior art addition method and peak value detection method without calculating a square root thus simplifying the operation circuit and decreasing the operation time.

The operation circuit may take various forms such as a comparator or a combination of a comparator and an adder or subtractor.

We claim:

1. Apparatus for calculating an amplitude value of a sinusoidal wave, comprising means for sampling the amplitude of said sinusoidal wave, a data sample extracting circuit including a zero point detector connected to the output of said data sampling means for comparing the sign of a present data sample with that of a data sample immediately preceding said present data sample to produce a zero point detection signal when the compared signs are not equal, circuit means responsive to said zero point detection signal for providing two other data samples sampled by said sampling means at two points spaced from the peak value of said sinusoidal wave, and an operation circuit responsive to the absolute values of said two other data samples for calculating therefrom the amplitude value of said sinusoidal wave.

2. The apparatus according to claim 1 wherein said two other data samples are sampled immediately before and after said peak value.

3. The apparatus according to claim 1 wherein one of said two other data samples is sampled at a first point in one half cycle of said sinusoidal wave and the other is sampled at a second point 90° spaced from said first point in an adjacent half cycle.

4. The apparatus according to claim 1 wherein said other data samples are sampled at a sampling frequency four times of the frequency of said sinusoidal wave.

5. The apparatus according to claim 1 wherein said operation circuit comprises means for calculating said amplitude value in accordance with an equation $$Y = k_{21} \cdot \text{Max}\{|i_m|, |i_{m-1}|\} + K_{22} \cdot \text{Min}\{|i_m|, |i_{m-1}|\}$$

where $K_{21}$ and $K_{22}$ are constants, $|i_m|$ and $|i_{m-1}|$ are the absolute values of said two other data samples, Max $\{|i_m|, |i_{m-1}|\}$ is a symbol representing the larger one of said two absolute values and Min$\{|i_m|, |i_{m-1}|\}$ is a symbol representing the smaller one of said two absolute values.

6. The apparatus according to claim 1 wherein said data sample extracting circuit comprises a zero point detector responsive to the output of said sampling means for detecting the fact that the sinusoidal wave has passed through a zero point, and a memory circuit which stores a series of data samples from said sampling means for producing two data samples immediately before and after the peak value of said sinusoidal wave in response to the output from said zero point detector.

7. The apparatus according to claim 1 wherein said data sample extracting circuit comprises a zero point detector responsive to the output of said sampling means for detecting the fact that said sinusoidal wave has passed through a zero point, a gate signal forming circuit responsive to the output from said zero point detector and the data sampled by said sampling means for producing a gate signal, and a gate circuit responsive to said gate signal for producing two data samples which are sampled at two points before and after a phase position 90° delayed from said zero point.

8. The apparatus according to claim 1 wherein said operation circuit comprises a comparator for selecting a smaller one of $|i_m|$ and $|i_{m-1}|$, a subtractor for determining the difference between $|i_{m-1}|$ and $|i_m|$ and for providing this difference as a positive value, a coefficient multiplier connected to said comparator and said subtractor for multiplying said comparator and subtractor outputs by respective predetermined constants and for providing said multiplied outputs as first and second signals, at least one of said constants being of a value other than unity, and an adder for adding together said first and second signals, where $|i_m|$ and $|i_{m-1}|$ represent the absolute value of said two other data samples $i_m$ and $i_{m-1}$ which are sampled by said sampling means.

9. The apparatus according to claim 1 wherein said operation circuit comprises, an adder for adding $|i_m|$ and $|i_{m-1}|$, a subtractor for subtracting $|i_{m-1}|$ from $|i_m|$ and for providing the difference as a positive value, a coefficient multiplier connected to said adder and subtractor for multiplying said adder and subtractor outputs by respective predetermined constants and for providing said multiplied outputs as first and second signals, at least one of said constants being of a value other than unity, and a second adder receiving said first and second signals from said coefficient multiplier for adding said first and second signals together, wherein $|i_m|$ and $|i_{m-1}|$ represent the absolute values of said two other data samples $i_m$ and $i_{m-1}$ which are sampled by said sampling means.

10. The apparatus according to claim 1 wherein said operation circuit comprises a comparator for providing as outputs signals a larger one and a smaller one of $|i_m|$ and $|i_{m-1}|$, a coefficient multiplier connected to said comparator for multiplying said output signals by respective predetermined constants and for providing said multiplied output signals as first and second signals, at least one of said constants being of a value other than unity, and an adder for adding together said first and second signals, wherein $|i_m|$ and $|i_{m-1}|$ represent the absolute values of said two other data samples $i_m$ and $i_{m-1}$ which are sampled by said sampling means.

11. The apparatus according to claim 1 wherein said operation circuit comprises a comparator for selecting a smaller one of $|i_m|$ and $|i_{m-1}|$, a first adder for adding $|i_m|$ and $|i_{m-1}|$, a coefficient multiplier connected to said comparator and adder for multiplying said comparator and adder outputs by respective predetermined constants and for providing said multiplied outputs as first and second signals, at least one of said constants being of a value other than unity, and a second adder for adding together said first and second signals, where $|i_m|$ and $|i_{m-1}|$ represent the absolute values of said two other data samples $i_m$ and $i_{m-1}$ which are sampled by said sampling means.

12. The apparatus according to claim 1 wherein said operation circuit comprises a comparator for selecting a larger one of $|i_m|$ and $|i_{m-1}|$, a first adder for adding $|i_m|$ and $|i_{m-1}|$, a coefficient multiplier connected to said comparator and adder for multiplying said comparator and adder outputs by respective predetermined constants and for providing said multiplied outputs as first and second signals, at least one of said constants being of a value other than unity, and a second adder for adding together said first and second signals, where $|i_m|$ and $|i_{m-1}|$ represent the absolute values of said two other data samples $i_m$ and $i_{m-1}$ which are sampled by said sampling means.

13. The apparatus according to claim 1 wherein said operation circuit comprises a comparator for selecting a larger one of $|i_m|$ and $|i_{m-1}|$, a subtractor for determining the difference between said $|i_m|$ and $|i_{m-1}|$ and for providing the difference as a positive value, a coefficient multiplier connected to said comparator and subtractor for multiplying said comparator and subtractor outputs by respective predetermined constants and for providing said multiplied outputs as first and second signals, at least one of said constants being of a value other than unity, and an adder for adding together said first and second signals where $|i_m|$ and $|i_{m-1}|$ represent the absolute values of said two other data samples $i_m$ and $i_{m-1}$ which are sampled by said sampling means.

14. Apparatus for calculating an amplitude value of a sinusoidal wave, comprising means for sampling the amplitude of said sinusoidal wave to create successive data samples, a data sample extracting circuit including a comparator connected to the output of said data sampling means for extracting from successive data samples of a half cycle of said sinusoidal wave a first data sample having a maximum absolute value of all said successive samples of a half cycle and a second data sample having an absolute value next in magnitude to said maximum value, and an operation circuit responsive to said absolute values of said first and second data samples for calculating therefrom the amplitude value of said sinusoidal wave.

* * * * *